United States Patent
Joung et al.

(10) Patent No.: US 9,673,185 B2
(45) Date of Patent: Jun. 6, 2017

(54) METHOD OF MANUFACTURING STACKED SEMICONDUCTOR PACKAGE

(71) Applicant: SAMSUNG ELECTRONICS CO., LTD., Suwon-si, Gyeonggi-do (KR)

(72) Inventors: Young-ho Joung, Asan-si (KR); Jong-gyu Kim, Asan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/661,155

(22) Filed: Mar. 18, 2015

(65) Prior Publication Data
US 2015/0311187 A1    Oct. 29, 2015

(30) Foreign Application Priority Data
Apr. 28, 2014    (KR) .................. 10-2014-0050926

(51) Int. Cl.
*H01L 21/56*    (2006.01)
*H01L 23/48*    (2006.01)
(Continued)

(52) U.S. Cl.
CPC ............ *H01L 25/50* (2013.01); *H01L 21/268* (2013.01); *H01L 21/2683* (2013.01); *H01L 21/4853* (2013.01); *H01L 21/67282* (2013.01); *H01L 21/76802* (2013.01); *H01L 23/544* (2013.01); *H01L 24/11* (2013.01); *H01L 25/105* (2013.01);
(Continued)

(58) Field of Classification Search
CPC ............... H01L 23/544; H01L 23/3128; H01L 23/49816; H01L 23/5389; H01L 24/10–24/17; H01L 2924/15331; H01L 25/043; H01L 25/0657; H01L 25/074; H01L 25/0756; H01L 25/117; H01L 25/50; H01L 2224/12105; H01L 2224/04105; H01L 24/11; H01L 2223/54433; H01L 21/4853; H01L 21/76802; H01L 21/268–21/2683; H01L 21/67282

See application file for complete search history.

(56) References Cited

U.S. PATENT DOCUMENTS 7,303,977 B2 * 12/2007 Voronov ................ B23K 26/40
257/E21.001
7,616,669 B2    11/2009 Grant et al.
(Continued)

FOREIGN PATENT DOCUMENTS

JP         11-114741 A     4/1999
KR      10-0283254 B1    12/2000
(Continued)

*Primary Examiner* — Marvin Payen
*Assistant Examiner* — Jeremy Joy
(74) *Attorney, Agent, or Firm* — Lee & Morse P.C.

(57) ABSTRACT

A method of manufacturing a stacked semiconductor package includes forming a semiconductor package, the semiconductor package having one or more semiconductor chips on an upper surface of a printed circuit board (PCB), and a mold layer covering the upper surface of the PCB, marking the semiconductor package with an identification mark by scanning a laser of a laser supply apparatus onto the semiconductor package, controlling a focus level of the laser, and performing laser drilling on the mold layer of the semiconductor package to form openings.

19 Claims, 15 Drawing Sheets

(51) Int. Cl.
*H01L 23/538* (2006.01)
*H01L 21/50* (2006.01)
*H01L 23/544* (2006.01)
*H01L 25/00* (2006.01)
*H01L 21/268* (2006.01)
*H01L 21/768* (2006.01)
*H01L 21/48* (2006.01)
*H01L 21/67* (2006.01)
*H01L 23/00* (2006.01)
*H01L 25/10* (2006.01)
*H01L 23/31* (2006.01)

(52) U.S. Cl.
CPC .......... *H01L 23/3128* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/83* (2013.01); *H01L 24/85* (2013.01); *H01L 2223/54406* (2013.01); *H01L 2223/54433* (2013.01); *H01L 2223/54486* (2013.01); *H01L 2224/131* (2013.01); *H01L 2224/16227* (2013.01); *H01L 2224/2919* (2013.01); *H01L 2224/32225* (2013.01); *H01L 2224/45124* (2013.01); *H01L 2224/45144* (2013.01); *H01L 2224/4847* (2013.01); *H01L 2224/48227* (2013.01); *H01L 2224/48463* (2013.01); *H01L 2224/73204* (2013.01); *H01L 2224/73265* (2013.01); *H01L 2224/83101* (2013.01); *H01L 2224/83104* (2013.01); *H01L 2224/85203* (2013.01); *H01L 2224/85205* (2013.01); *H01L 2224/85207* (2013.01); *H01L 2225/1023* (2013.01); *H01L 2225/1058* (2013.01); *H01L 2225/1076* (2013.01); *H01L 2924/15311* (2013.01); *H01L 2924/15331* (2013.01); *H01L 2924/181* (2013.01); *H01L 2924/18161* (2013.01)

(56) References Cited

U.S. PATENT DOCUMENTS

| | | | |
|---|---|---|---|
| 7,851,894 B1 * | 12/2010 | Scanlan | H01L 23/3128 257/659 |
| 7,915,564 B2 | 3/2011 | Kaplan et al. | |
| 8,076,776 B2 | 12/2011 | Bhate et al. | |
| 8,081,668 B2 | 12/2011 | Grant et al. | |
| 8,557,629 B1 * | 10/2013 | Kim | H01L 23/3128 257/433 |
| 8,816,246 B2 | 8/2014 | Murison et al. | |
| 9,102,011 B2 * | 8/2015 | Hosseini | B23K 26/0069 |
| 2002/0170897 A1 * | 11/2002 | Hall | B08B 7/0042 219/121.73 |
| 2006/0166383 A1 * | 7/2006 | Lee | H01L 23/544 438/15 |
| 2006/0197094 A1 * | 9/2006 | Sugawara | H01L 33/20 257/79 |
| 2008/0139707 A1 | 6/2008 | Kawakami et al. | |
| 2010/0025387 A1 * | 2/2010 | Arai | B28D 5/00 219/121.69 |
| 2010/0065971 A1 * | 3/2010 | Li | C23C 16/483 257/775 |
| 2010/0072599 A1 * | 3/2010 | Camacho | H01L 21/6835 257/686 |
| 2010/0171205 A1 * | 7/2010 | Chen | H01L 21/565 257/686 |
| 2010/0171207 A1 * | 7/2010 | Shen | H01L 21/4853 257/686 |
| 2010/0193481 A1 | 8/2010 | Osako | |
| 2011/0031590 A1 * | 2/2011 | Vakanas | B23K 26/36 257/618 |
| 2011/0084050 A1 * | 4/2011 | Togashi | B23K 26/0673 219/121.67 |
| 2011/0241193 A1 * | 10/2011 | Ding | H01L 21/6835 257/686 |
| 2011/0259631 A1 * | 10/2011 | Rumsby | B23K 26/0613 174/264 |
| 2012/0038040 A1 * | 2/2012 | Jang | H01L 23/49811 257/737 |
| 2013/0001767 A1 * | 1/2013 | Kajiki | H01L 23/3128 257/734 |
| 2013/0095259 A1 | 4/2013 | Fukue et al. | |
| 2013/0175243 A1 | 7/2013 | Wang | |
| 2013/0200524 A1 * | 8/2013 | Han | H01L 25/105 257/774 |
| 2015/0348904 A1 * | 12/2015 | Huang | H01L 21/76802 257/774 |
| 2015/0357251 A1 * | 12/2015 | Usami | H01L 23/00 438/7 |

FOREIGN PATENT DOCUMENTS

| | | |
|---|---|---|
| KR | 10-2007-0004624 A | 1/2007 |
| KR | 10-2007-0085548 A | 8/2007 |
| KR | 10-2009-0008942 A | 1/2009 |
| KR | 10-2010-0048773 A | 5/2010 |
| KR | 10-2013-0036957 A | 4/2013 |
| KR | 10-2013-0036958 A | 4/2013 |
| KR | 10-2013-0049375 A | 5/2013 |
| KR | 10-2013-0056427 A | 5/2013 |
| KR | 10-2013-0069593 A | 6/2013 |
| KR | 10-2013-0096840 A | 9/2013 |
| KR | 10-2013-0105189 A | 9/2013 |
| KR | 10-2013-0126201 A | 11/2013 |
| KR | 10-1391639 B1 | 4/2014 |

* cited by examiner

METHOD OF MANUFACTURING STACKED SEMICONDUCTOR PACKAGE

CROSS-REFERENCE TO RELATED APPLICATION

Korean Patent Application No. 10-2014-0050926, filed on Apr. 28, 2014, in the Korean Intellectual Property Office, and entitled: "Method of Manufacturing Stacked Semiconductor Package," is incorporated by reference herein in its entirety.

BACKGROUND

1. Field

Embodiments relate to a method of manufacturing a stacked semiconductor package, and more particularly, to a method of manufacturing a stacked semiconductor package, in which marking and drilling are performed by using a laser.

2. Description of the Related Art

As small multi-applications that function, e.g., as a mobile communication terminal, a portable Internet device, and a portable multimedia terminal have been developed, various stacked semiconductor package technologies capable of reducing weight, thickness, length, and size of a stacked semiconductor package and manufacturing a highly integrated stacked semiconductor package with high capacity have been developed. When a stacked semiconductor package is manufactured, a marking process for respectively marking different semiconductor packages with unique identification numbers and a drilling process for connecting the stacked semiconductor packages to each other are required.

SUMMARY

Embodiments provide a method of manufacturing a stacked semiconductor package in which marking and drilling processes may be sequentially performed by one laser facility.

According to an aspect of embodiments, there is provided a method of manufacturing a stacked semiconductor package, the method including forming a semiconductor package, the semiconductor package having one or more semiconductor chips on an upper surface of a printed circuit board (PCB), and a mold layer covering the upper surface of the PCB, marking the semiconductor package with an identification mark by scanning a laser of a laser supply apparatus onto the semiconductor package, controlling a focus level of the laser, and performing laser drilling on the mold layer of the semiconductor package to form openings.

Controlling the focus level of the laser may include moving at least a part of the laser supply apparatus in a first direction perpendicular to a plane formed by an upper surface of the semiconductor package.

Controlling the focus level of the laser may include a first adjustment of the focus level of the laser before marking the semiconductor package.

The first adjustment of the focus level of the laser may include adjusting the focus level of the laser to be lower than a level of the upper surface of the semiconductor package.

The first adjustment of the focus level of the laser may include adjusting the focus level of the laser to be higher than a level of the upper surface of the semiconductor package.

Controlling of the focus level of the laser may include a second adjustment of the focus level of the laser before performing the laser drilling on the mold layer to form the openings.

The second adjustment may include adjusting the focus level of the laser to be the same as a level of the upper surface of the semiconductor package.

Forming the semiconductor package may include forming solder balls on the upper surface of the PCB, forming the mold layer to cover the upper surface of the PCB and the solder balls, and at least partially exposing the solder balls through the openings in the mold.

The laser supply apparatus may include a Y mirror for changing a path of the laser to a second direction parallel to the upper surface of the semiconductor package, and a Z mirror for changing the path of the laser to a third direction parallel to the upper surface of the semiconductor package and orthogonal to the second direction, and scanning the laser onto the semiconductor package includes controlling the Y and Z mirrors to focus the laser at Y and Z coordinates to perform the marking or laser drilling on the semiconductor package.

The Y and Z coordinates may include first Y and Z coordinates designating location for the laser drilling, and second Y and Z coordinates designating location for the marking, the second Y and Z coordinates being positioned in one of the one or more semiconductor chips.

The Y and Z coordinates may include first Y and Z coordinates designating location for the laser drilling, and second Y and Z coordinates designating location for the marking, the second Y and Z coordinates being positioned in the mold layer.

According to another aspect of embodiments, there is provided a method of manufacturing a stacked semiconductor package, the method including forming a lower semiconductor package, and stacking an upper semiconductor package on the lower semiconductor package, wherein forming the lower semiconductor package includes mounting one or more semiconductor chips on an upper surface of a PCB, forming first solder balls on the upper surface of the PCB, forming a mold layer covering the upper surface of the PCB and the first solder balls, marking the lower semiconductor package with an identification mark by scanning a laser of a laser supply apparatus onto the lower semiconductor package, controlling a focus level of the laser, performing laser drilling on the mold layer of the lower semiconductor package to form openings, and forming second solder balls on a lower surface of the PCB.

Performing laser drilling on the mold layer to form openings may include forming the openings with inclined side surfaces.

The laser scanned by the laser supply apparatus may have a single wavelength.

Marking the lower semiconductor package and performing the laser drilling on the mold layer may be performed by using a single light source.

According to another aspect of embodiments, there is provided a method of manufacturing a stacked semiconductor package, the method including forming a semiconductor package, the semiconductor package having one or more semiconductor chips on an upper surface of a printed circuit board (PCB), and a mold layer covering the upper surface of the PCB, marking the semiconductor package with an identification mark by scanning a laser of a laser supply apparatus onto the semiconductor package, controlling a focus level of the laser, and drilling the mold layer of the semiconductor package by scanning the laser of the laser supply apparatus onto the semiconductor package to form openings through the mold layer.

Marking and drilling of the semiconductor package may be performed by a same laser source.

Controlling the focus level of the laser may include focusing a lens of the laser source to perform drilling, and defocusing the lens of the laser source to perform marking.

Marking may include forming at least a first cavity in the semiconductor package, and drilling includes forming at least a second cavity in the semiconductor package, the at least second cavity being deeper than the first cavity.

Laser irradiation toward the semiconductor package during marking may be shorter than during drilling.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
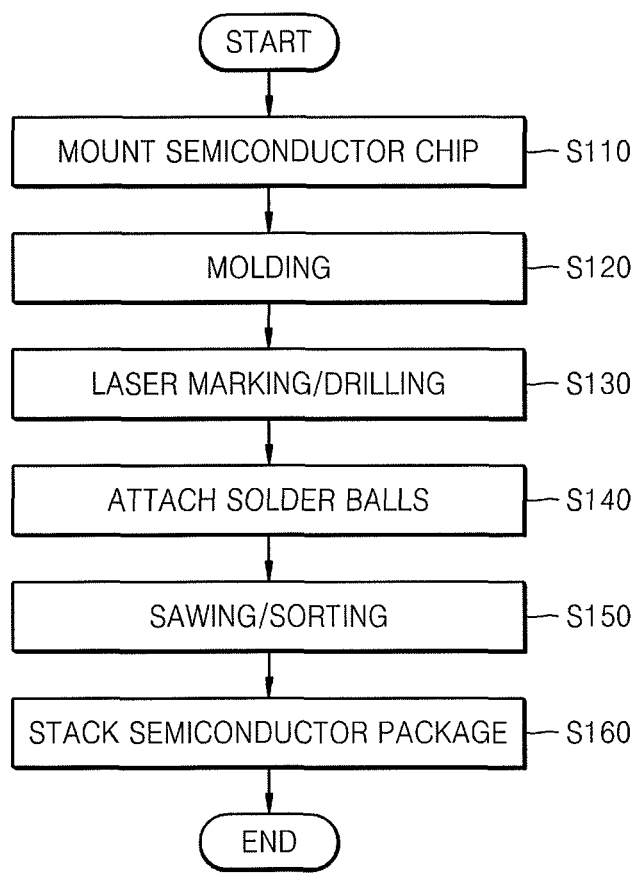
FIG. 1 illustrates a flowchart of a method of manufacturing a stacked semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first and second, etc., may be used herein to describe various members, regions, layers, portions, and/or elements, these members, regions, layers, portions, and/or elements should not be limited by these terms. These terms are only used to distinguish one member, region, layer, portion, or element from another member, region, layer, portion, or element. For example, a first element may be named a second element and similarly a second element may be named a first element without departing from the scope of the embodiments.

Unless otherwise defined, all terms (including technical and scientific terms) used herein have the same meanings as commonly understood by one of skill in the art. When a certain embodiment may be differently implemented, a specific process may be performed in an order different from a described order. For example, two processes which are described as being consecutively performed may be simultaneously performed and may be performed in an order opposite to a described order.

In the accompanying drawings, for example, in accordance with manufacturing technology and/or allowance, modifications of illustrated shapes may be estimated. Therefore, in the exemplary embodiments, regions illustrated in the current specification should not be construed as limited to specific shapes and should include changes in shapes caused in manufacturing processes.

Figure 2A:
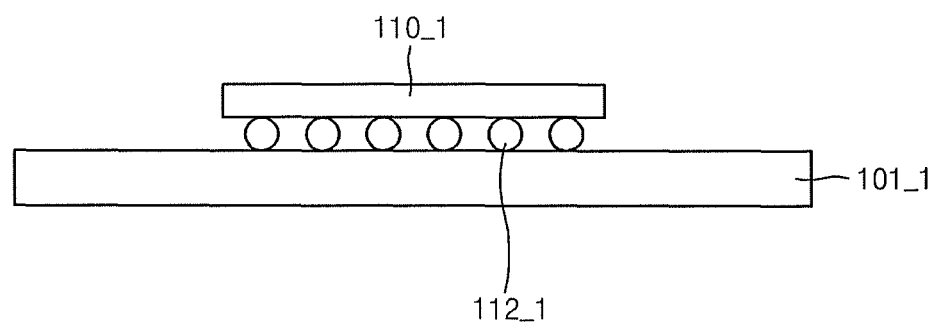
FIG. 2A illustrates a cross-sectional view of a stacked semiconductor package manufactured by a method according to an embodiment.
Figure 2B:
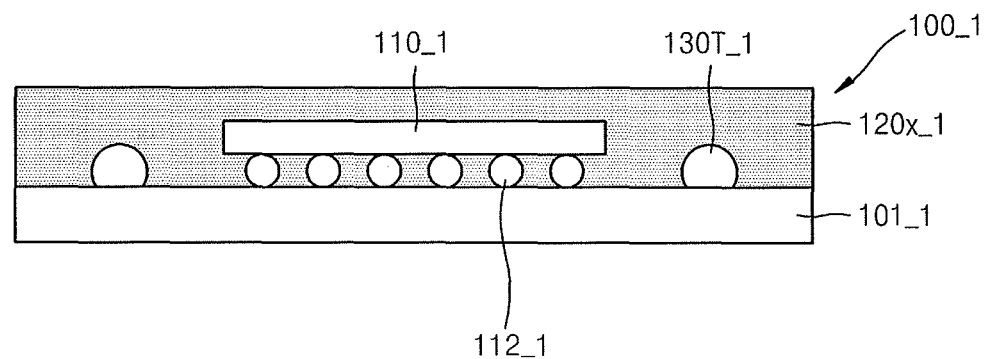
FIGS. 2B to 2D illustrate cross-sectional views of processes in a method of manufacturing a stacked semiconductor package according to an embodiment.
Figure 2C:
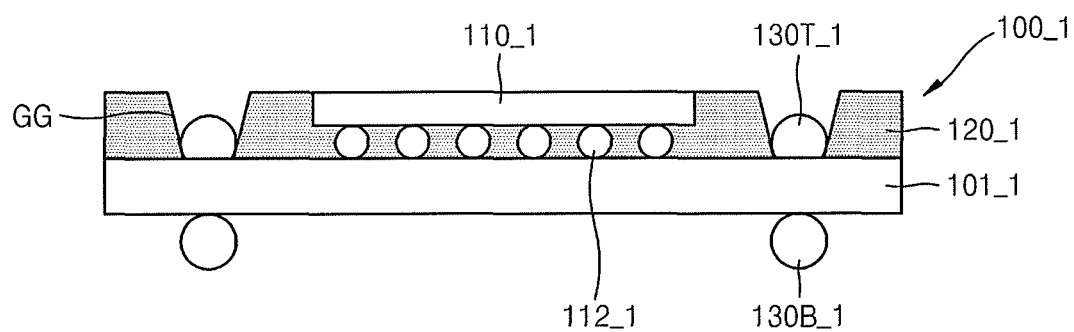
Figure 2D:
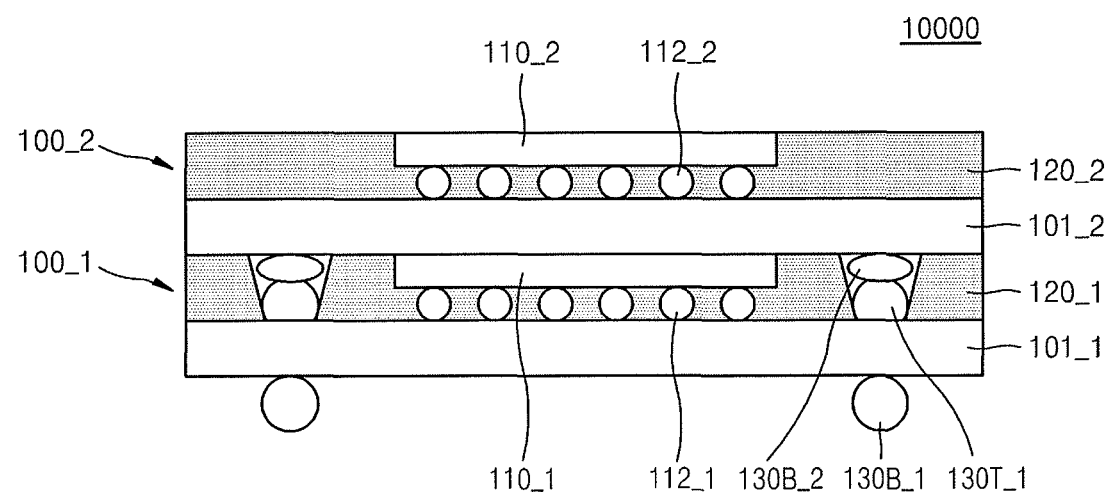

FIG. 1 is a flowchart illustrating a method of manufacturing a stacked semiconductor package according to an embodiment. FIG. 2A is a cross-sectional view of a stacked semiconductor package manufactured by a method according to an embodiment. FIGS. 2B to 2D are cross-sectional views illustrating processes of a method of manufacturing a stacked semiconductor package according to an embodiment.

Hereinafter, for clarity, a description of a common stacked semiconductor packaging process from a starting process to a process before mounting a semiconductor chip will not be given.

Referring to FIGS. 1 to 2D, a method of manufacturing a stacked semiconductor package 10000 may include operations S110 to S150, in which a lower semiconductor package 100_1 is formed (FIGS. 2A-2C), and operation S160, in which an upper semiconductor package 100_2 is stacked on the lower semiconductor package 100_1 (FIG. 2D). Since the lower semiconductor package 100_1 and the upper semiconductor package 100_2 may be manufactured by similar methods, hereinafter, a method of manufacturing the lower semiconductor package 100_1 will be mainly described.

Referring to FIGS. 1 and 2A, in order to manufacture the lower semiconductor package 100_1, first, a semiconductor chip 110_1 is mounted on an upper surface of a printed circuit board (PCB) 101_1 in operation S110.

The PCB 101_1 may be a flat plate including upper and lower surfaces. A wiring unit (not shown) may be formed on the upper surface of the PCB 101_1. The wiring unit is a circuit pattern formed in the PCB 101_1, and may be formed of a metal wiring line, e.g., copper (Cu). The PCB 101_1 may be a single-sided PCB, a double-sided PCB, or a multi-layer PCB including one or more internal wiring patterns (not shown) in a substrate. Furthermore, the PCB 101_1 may be a rigid PCB or a flexible PCB.

The semiconductor chip 110_1 may be a memory chip or a logic chip, and at least one semiconductor chip in which the memory chip and the logic chip are stacked. The semiconductor chip 110_1 may be mounted on the upper surface of the PCB 101_1, e.g., by flip-chip bonding or wire bonding. For example, as illustrated in FIG. 2A, when the semiconductor chip 110_1 is mounted on the upper surface of the PCB 101_1 by the flip-chip bonding, the semiconductor chip 110_1 is combined with the PCB 101_1 through bumps 112_1.

In another example (not illustrated), the semiconductor chip 110_1 may be mounted on the upper surface of the PCB 101_1 by the wire bonding. In this case, the semiconductor chip 110_1 is attached to the upper surface of the PCB 101_1 through an adhesive tape (not shown), and the semiconductor chip 110_1 and the PCB 101_1 are electrically connected through bonding wires (not shown). The bonding wires (not shown) may be formed, e.g., of gold (Au) or aluminum (Al), and may be ball bonded or wedge bonded. In some embodiments, the bonding wires (not shown) may be connected to the semiconductor chip 110_1 and the PCB 101_1 by thermo-compression bonding or ultrasonic bonding and by thermo-sonic bonding in which the thermo-compression bonding and the ultrasonic bonding are mixed.

Although not shown, the PCB 101_1, on which the semiconductor chip 110_1 is mounted, undergoes a transfer process for a subsequent process after being mounted on a transfer unit (not shown). The transfer unit may be a rail or a robot arm, which will be described in detail with reference to FIGS. 3A and 3B.

Next, as illustrated in FIG. 2B, solder balls 130T_1 may be formed on the upper surface of the PCB 101_1. The solder balls 130T_1 are formed before depositing a molding resin for forming the mold layer 120x_1, as will be described in detail below.

Referring to FIGS. 1 and 2B-2C, after mounting the semiconductor chip 110_1 and the solder balls 130T_1 on the PCB 101_1, a mold layer 120x_1 that covers the upper surface of the PCB 101_1 and the solder balls 130T_1 is formed in operation S120. After deposition, the mold layer 120x_1 may be processed to reduce its height level. For example, as illustrated in FIG. 2C, the mold layer 120x_1 may be formed to be at a same height level with an upper surface of the semiconductor chip 110_1. In another example, as illustrated in FIG. 7C, the mold layer may be higher than the upper surface of the semiconductor chip 110_1 as will be described later. Although not described, a baking process for removing moisture may be additionally performed before the mold layer forming in operation S120.

The mold layer 120x_1 may be formed by depositing an appropriate amount of the molding resin onto the PCB 101_1 via a depositing element, e.g., a nozzle, and pressing the molding resin via a pressing element, e.g., a press. Process conditions, e.g., a delay between the deposition of the molding resin and pressing thereof, the amount of deposited molding resin, a pressing temperature, and pressure may be set in consideration of the physical characteristics, e.g., viscosity of the molding resin.

In some embodiments, the molding resin may be, e.g., an epoxy-group molding resin or polyimide-group molding resin. The epoxy-group molding resin may be, e.g., a polycyclic aromatic epoxy resin, bisphenol-group epoxy resin, naphthalene-group epoxy resin, ortho-cresol novolac epoxy resin, dicyclopentadiene epoxy resin, biphenyl-group epoxy resin, or phenol novolac epoxy resin.

In some embodiments, the molding resin may include carbon black that is a colorant. A chemical component of the carbon black may be, e.g., carbon (C).

In some embodiments, the molding resin may further include a hardener, a hardening accelerator, and a flame retardant. The hardener may be formed of, e.g., amine, polycyclic aromatic phenol resin, phenol novolac resin, cresol novolac resin, dicyclopentadiene phenol resin, xyloc resin, and naphthalene resin. The hardening accelerator as a catalyst for accelerating a hardening reaction between the epoxy-group molding resin and the hardener may be formed of, e.g., tertiary amines such as benzyldimethylamine, triethanolamine, triethylenediamine, dimethylaminoethanol, and tris(dimethylaminomethyl)phenol, imidazol such as 2-methylimidazol and 2-phenylimidazol, organic phosphine such as triphenylphosphine, diphenylphosphine, and phenylphosphine, and tetraphenyl boron salt such as tetraphenylphosphonium, tetraphenylborate, and triphenylphosphine. The flame retardant may be formed of, e.g., brominated epoxy resin, antimony oxide, and metal hydride.

The molding resin may further include a mold release agent, e.g., high quality fatty acid, high quality fatty acid metal salt, and ester-based wax, and a tension relaxant, e.g., modified silicone oil, silicon powder, and silicon resin.

The molding resin may have a viscosity suitable for the molding conditions. For example, the molding resin may be a fluidic solid, e.g., gel.

For example, when the semiconductor chip 110_1 is mounted on the upper surface of the PCB 101_1 by the flip-chip bonding like in the current embodiment, the mold layer 120x_1 may be formed by a molded under fill (MUF) process. In the MUF process, a space between the semiconductor chip 110_1 and the PCB 101_1 is filled with the molding resin (of the mold layer 120x_1) without additionally performing a process of filling a space between the semiconductor chip 110_1 and the PCB 101_1 with underfill (not shown). Therefore, when the mold layer 120x_1 is formed by the MUF process, a molding member material that covers an outline of the semiconductor chip 110_1 is the same as the molding member between the semiconductor chip 110_1 and the PCB 101_1. In other words, when a molding resin is deposited by the MUF process to form the mold layer 120x_1 on the semiconductor chip 110_1, the space between the semiconductor chip 110_1 and the PCB 101_1 is filled in the same process and with the same molding resin material, thereby eliminating a need for a separate process and/or material.

In another example, the mold layer 120x_1 may be formed without using the MUF process. That is, the space between the semiconductor chip 110_1 and the PCB 101_1 may be filled with an underfill (not shown), and subsequently, the outline of the semiconductor chip 110_1 may be covered with an external molding member (not shown) defining the mold layer 120x_1. The underfill (not shown) for filling the space between the semiconductor chip 110_1 and the PCB 101_1 and the external molding member (not shown) that covers the outline of the semiconductor chip 110_1 may be formed of the same material or different materials.

Referring back to FIG. 1, after forming the mold layer 120x_1, laser marking and drilling processes are performed in operation S130. Although not described, a baking process for hardening the mold layer 120x_1 may be additionally performed before the laser marking and drilling processes of operation S130.

In detail, the laser marking and drilling processes in operation S130 may include a laser marking process of modifying (for example, melting, evaporating, and etching), imprinting, or coloring a surface of the lower semiconductor package 100_1 by a laser scanned by a laser supply apparatus (not shown) to form a marking unit Mc1 (refer to FIG. 5A) on the surface of the lower semiconductor package 100_1. In addition, operation S130 may further include a laser focus level controlling process of controlling a focus level of the laser, and a laser drilling process of performing laser drilling on the mold layer 120x_1 to form a molding unit 120_1 including openings GG. As illustrated in FIG. 2C, the openings GG through the molding unit 120_1 expose the solder balls 130T_1 on the upper surface of the PCB 101_1, which will be described with reference to FIGS. 4A to 4C.

Referring back to FIGS. 1 and 2C, after the laser marking and drilling processes of operation S130, a solder ball attach (SBA) process of attaching solder balls 130B_1 onto the lower surface of the PCB 101_1 is performed in operation S140. Next, a sawing process of cutting a plurality of lower semiconductor packages (not shown) that form a group for a former process into separate lower semiconductor packages 100_1 and a sorting process of classifying the plurality of cut lower semiconductor packages in accordance with a predetermined reference are performed in operation S150 to complete the lower semiconductor package 100_1.

Then, as illustrated in FIG. 2D, the upper semiconductor package 100_2 is stacked on the lower semiconductor package 100_1. The upper semiconductor package 100_2 may be manufactured by a method similar to that of the above-described lower semiconductor package 100_1, a repeated description of which will not be given for convenience sake. The lower semiconductor package 100_1 and the upper semiconductor package 100_2 are electrically connected to each other by combining the solder balls 130T_1 of the lower semiconductor package 100_1 and solder balls 130B_2 of the upper semiconductor package 100_2 with each other.

In general, when one or more semiconductor packages are combined with each other, warping may occur in the lower semiconductor package and/or the upper semiconductor package. For example, solder balls of the lower semiconductor package and solder balls of the upper semiconductor package may not be correctly combined with each other, thereby causing defects.

In contrast, according to embodiments, the solder balls 130T_1 are formed on the upper surface of the PCB 101_1 before the mold layer forming operation S120. That is, the mold layer 120x_1 is formed, after formation of the solder balls 130T_1, to cover the solder balls 130T_1 as well as the upper surface of the PCB 101_1, followed by forming the openings GG in the molding unit 120_1 through the laser drilling process to at least partially expose the solder balls 130T_1. Accordingly, a warping difference between the lower semiconductor package 100_1 and the upper semiconductor package 100_2 may be minimized through the above process. As described above, after respectively manufacturing the lower semiconductor package 100_1 and the upper semiconductor package 100_2, the lower semiconductor package 100_1 and the upper semiconductor package 100_2 may be stacked to manufacture the stacked semiconductor package 10000.

Figure 3A:
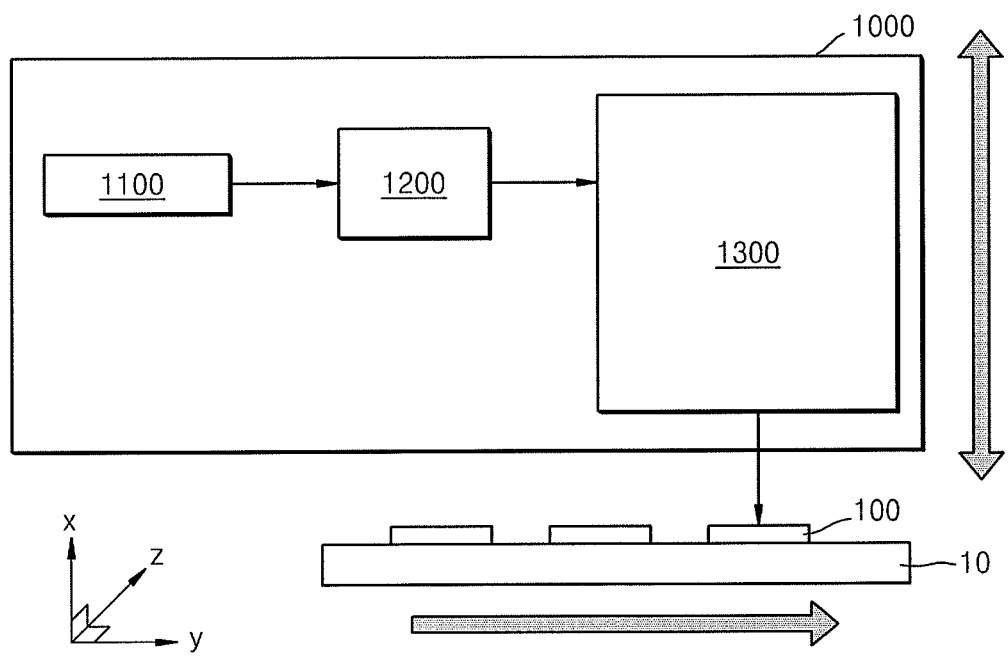
FIGS. 3A to 3C illustrate conceptual diagrams of a laser supply apparatus and a transfer unit for manufacturing a stacked semiconductor package according to an embodiment.
Figure 3B:
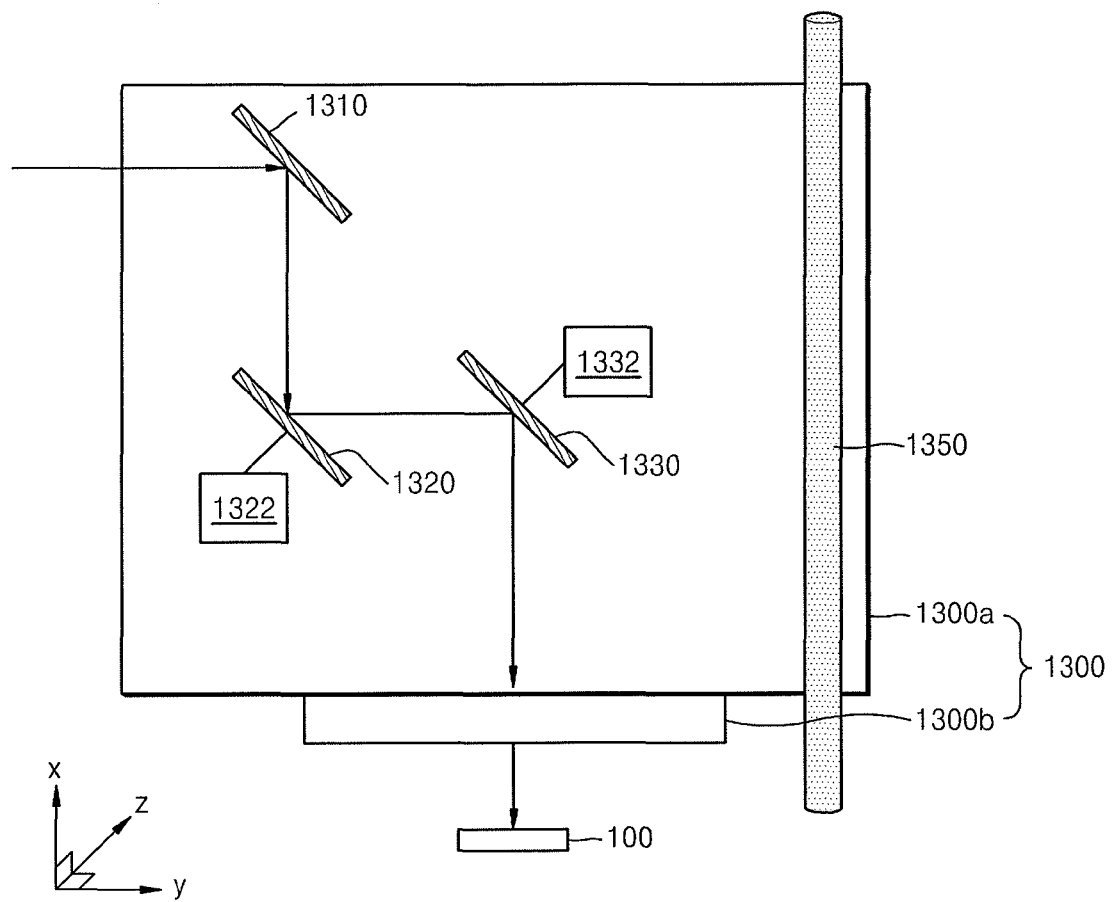
Figure 3C:
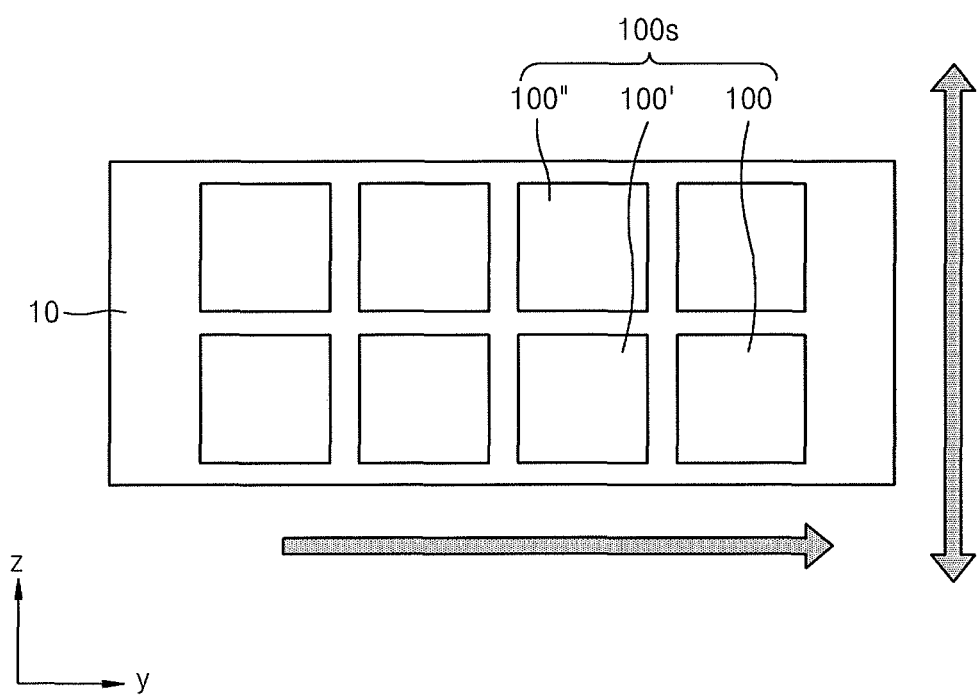

FIGS. 3A to 3C are conceptual diagrams of a laser supply apparatus and a transfer unit for manufacturing a stacked semiconductor package according to an embodiment. Referring to FIGS. 3A to 3C, a laser supply apparatus 1000 scans a laser to a semiconductor package 100 mounted on a transfer unit 10 to perform a laser marking or drilling process. The semiconductor package 100 may be the lower semiconductor package 100_1 before attaching the solder balls 130B_1 (refer to FIGS. 1 to 2D), a repeated description of which will be omitted for convenience.

The laser supply apparatus 1000 may include a laser light source 1100, a laser diameter controller 1200, and a laser processing unit 1300.

A kind of the laser light source 1100 is not limited. For example, an apparatus for outputting a laser with high linearity such as a gas laser, e.g., a helium-neon laser or an excimer laser, a solid laser, e.g., a ruby laser or an Nd:YAG laser, or a semiconductor laser may be used as the laser light source 1100.

The laser light source 1100 may scan a laser of a single wavelength. In some embodiments, the laser light source 1100 may include a laser diode (not shown) that emits a laser of a wavelength, e.g., about 1,064 nm, in an infrared (IR) range.

The laser diameter controller 1200 may control a diameter of the laser emitted by the laser light source 1100. The laser diameter controller 1200 may be, e.g., a beam expander telescope (BET).

In some embodiments, the laser diameter controller 1200 may collimate the laser so that parallel rays are incident on the laser processing unit 1300. In order to make the light output from the light source 1100 parallel with an optical axis, the laser diameter controller 1200 may further include a collimating lens (not shown).

The laser processing unit 1300 may include a scanner 1300a and a telecentric lens 1300b arranged under the scanner 1300a, as illustrated in FIG. 3B.

The scanner 1300a may include a reflecting mirror 1310 for reflecting the laser emitted by the laser light source 1100, an X axis motor 1350, a Y mirror 1320, a Y axis motor 1322, a Z mirror 1330, and a Z axis motor 1332.

The reflecting mirror 1310 reflects the laser emitted by the laser light source 1100 to the Y mirror 1320. Unlike in the current embodiment, a position of the Y mirror 1320 may be exchanged with that of the Z mirror 1330. In this case, the reflecting mirror 1310 reflects the laser emitted by the laser light source 1100 to the Z mirror 1330. The Y mirror 1320 and the Z mirror 1330 change a path of the laser to form a laser focus at Y and Z coordinates at which the laser marking or drilling process is to be performed.

Specifically, the Y mirror 1320 may change the path of the laser emitted by the laser light source 1100 to a second direction (the Y direction of FIG. 3C) parallel to an upper surface of the semiconductor package 100. The Y mirror 1320 may be controlled by the Y axis motor 1322 connected to the Y mirror 1320. The Z mirror 1330 may change the path of the laser to a third direction (the Z direction of FIG. 3C) parallel to the upper surface of the semiconductor package 100 and orthogonal to the second direction. The Z mirror 1330 may be controlled by the Z axis motor 1332 connected to the Z mirror 1330.

The X axis motor 1350 moves the scanner 1300a in a first direction (the X direction of FIG. 3B) perpendicular to a plane (a plane formed by the Y and Z axes of FIG. 3C) formed by the upper surface of the semiconductor package 100. Since the telecentric lens 1300b is fixed to a lower portion of the scanner 1300a, as a result, the scanner 1300a and the telecentric lens 1300b, i.e., the laser processing unit 1300, moves in the first direction in its entirety. As the laser processing unit 1300 is moved in the first direction by the X axis motor 1350, the focus F (refer to FIG. 4A) level of the laser scanned by the laser processing unit 1300 may be controlled, which will be described in detail with reference to FIGS. 4A to 4C.

Referring back to FIG. 3B, the telecentric lens 1300*b* transmits the laser scanned by the scanner 1300*a* to the semiconductor package 100. In some embodiments, the telecentric lens 1300*b* may concentrate the laser scanned by the scanner 1300*a*.

Although not shown, the telecentric lens 1300*b* may include an image-space telecentric lens (not shown), i.e., that makes the laser reflected from the Z mirror 1330 parallel with a laser optical axis (not shown), and an object-space telecentric lens (not shown), i.e., for concentrating the incident laser to be parallel with the optical axis through the image-space telecentric lens (not shown). An optical axis (not shown) of the image-space telecentric lens and an optical axis (not shown) of the object-space telecentric lens may coincide with each other.

Referring to FIG. 3C, the transfer unit 10 mounts and transfers one or more semiconductor packages 100, 100', and 100". For example, the transfer unit 10 may be a rail, e.g., a conveyor, as illustrated in FIGS. 3A and 3C. However, embodiments are not limited thereto.

In some embodiments, the transfer unit 10 may select a semiconductor package to perform laser marking or drilling among the one or more semiconductor packages 100, 100', and 100". For example, after laser marking and drilling of the semiconductor package 100, the transfer unit 10 may move in the second direction (the Y direction of FIG. 3C) for the laser supply apparatus 1000 to perform laser marking and drilling of the semiconductor package 100'. After the laser marking and drilling of the semiconductor package 100', the transfer unit 10 may move in the third direction (the Z direction of FIG. 3C) for the laser supply apparatus 1000 tot perform laser marking and drilling of the semiconductor package 100".

The movement path of the transfer unit 10 with respect to FIG. 3C is only exemplary. As described above, since the transfer unit 10 moves in the second or third direction, the laser marking and drilling may be performed on each of the one or more semiconductor packages 100, 100', and 100" in any order.

Figure 4A:
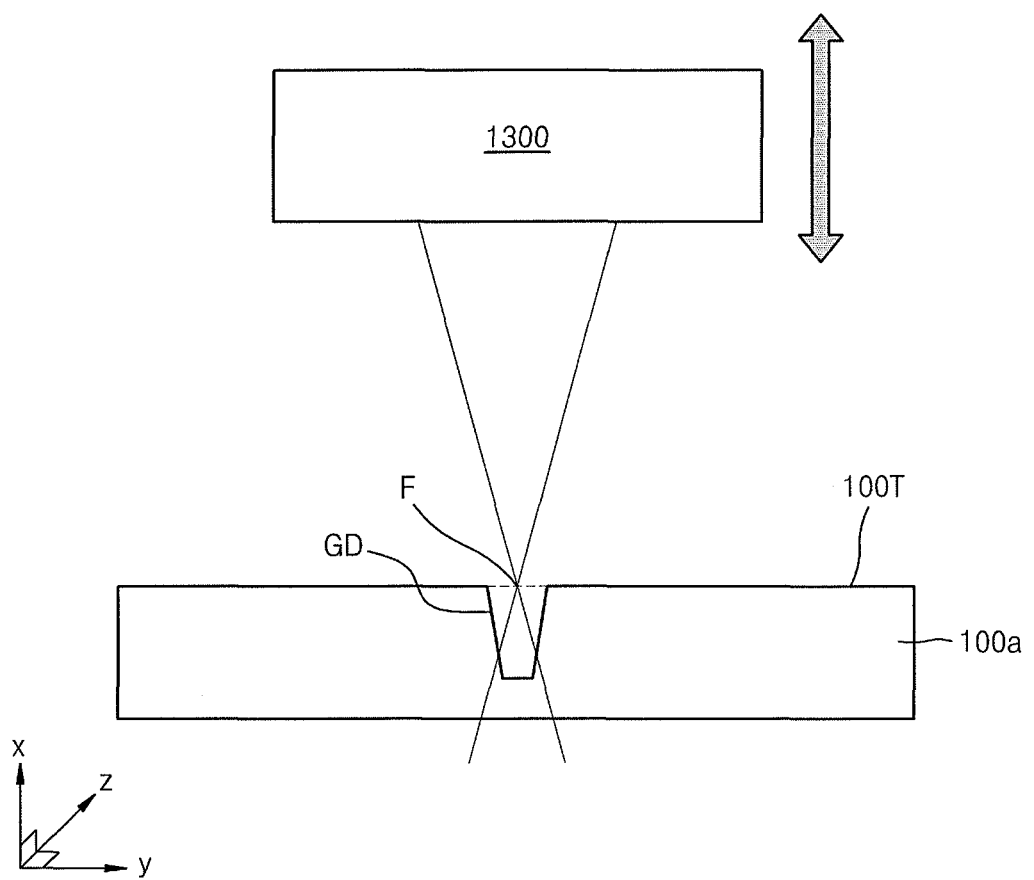
FIG. 4A illustrates a conceptual diagram of a laser drilling process according to an embodiment.
Figure 4B:
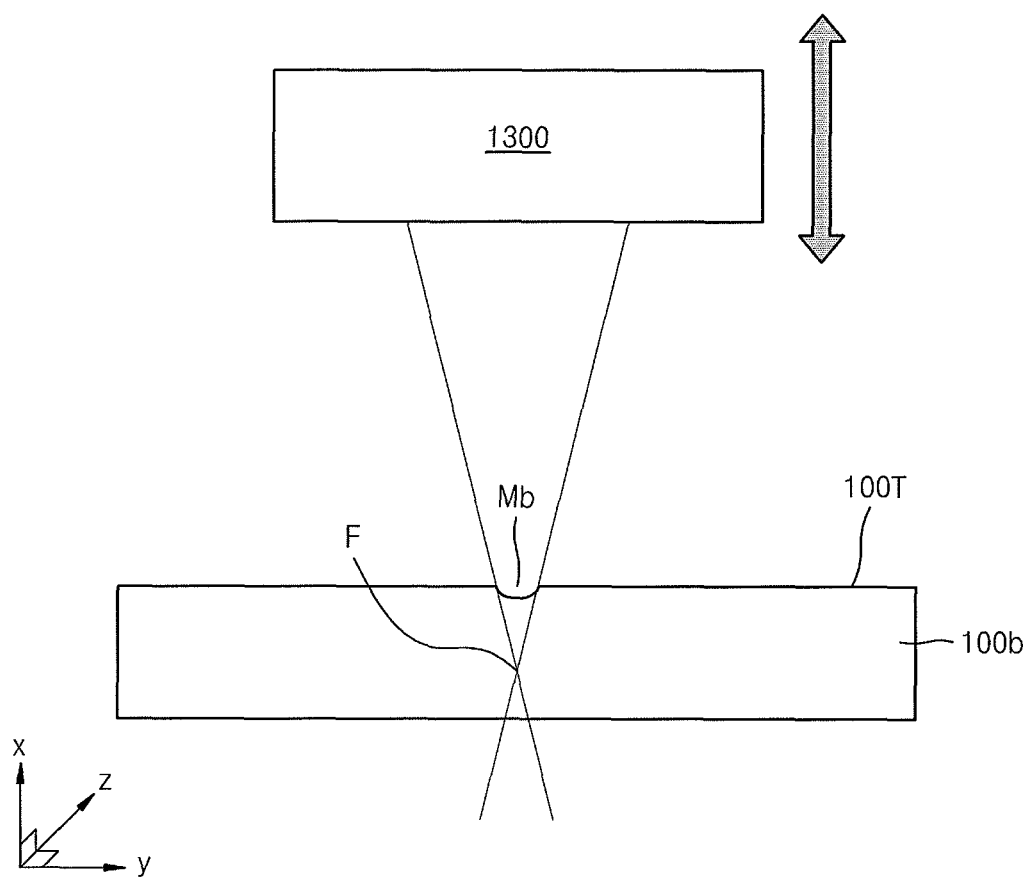
FIGS. 4B and 4C illustrate conceptual diagrams of a laser marking process according to embodiments.
Figure 4C:
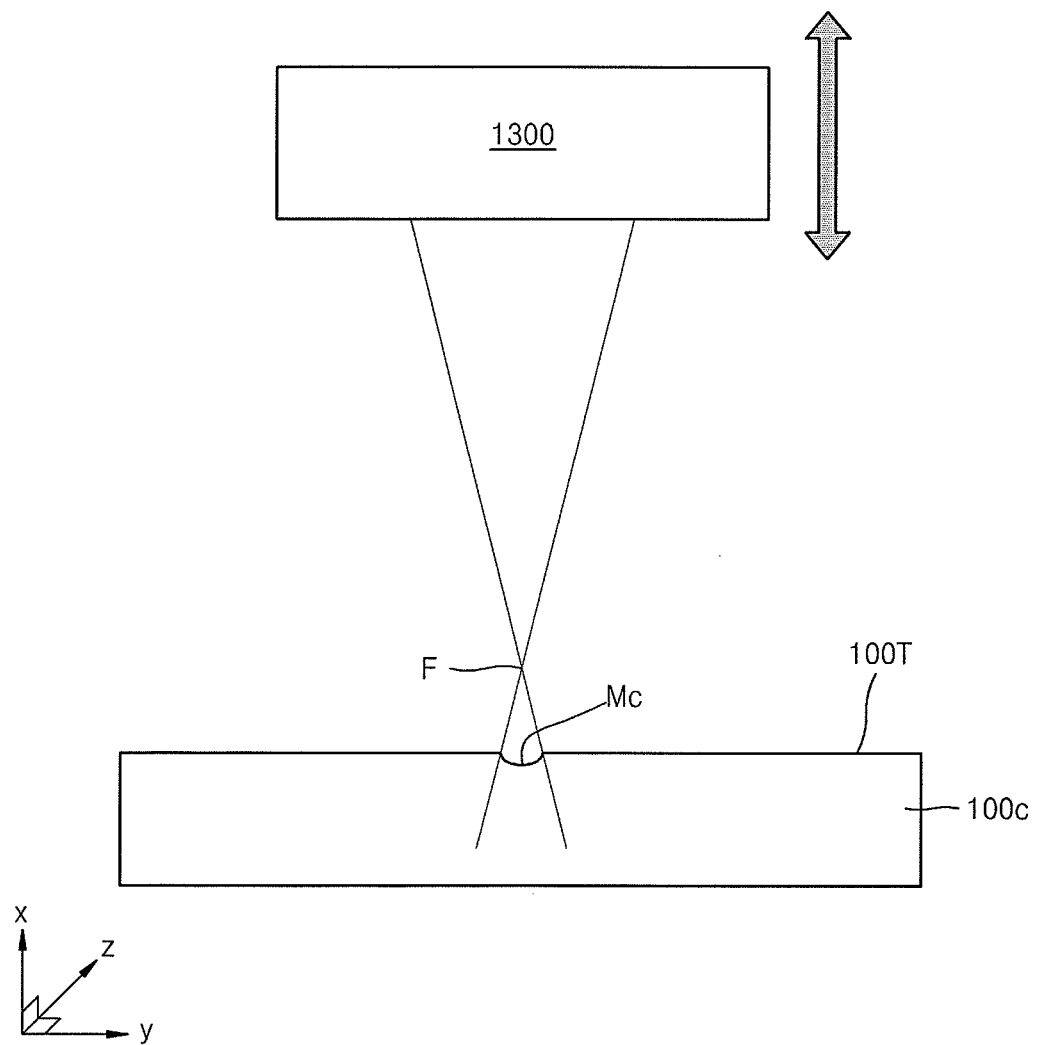

FIG. 4A is a conceptual diagram of a laser drilling process according to an embodiment. FIGS. 4B and 4C are conceptual diagrams of a laser marking process according to embodiments. In FIGS. 4A to 4C, same reference numerals as those of FIGS. 1 to 3C denote the same elements, and each of semiconductor packages 100*a*, 100*b*, and 100*c* may be the lower semiconductor package 100_1 before attaching the solder balls 130B_1 (refer to FIGS. 1 to 2D).

Referring to FIG. 4A, the laser processing unit 1300 scans a laser onto an upper surface 100T of the semiconductor package 100*a* to form an opening GD. At this time, a focus F level of the laser scanned by the laser processing unit 1300 is adjusted to be the same as a level of the upper surface 100T of the semiconductor package 100*a*.

In some embodiments, the focus F level of the laser may be controlled before the laser drilling process. The focus F level of the laser may be controlled by the laser processing unit 1300 moving in the first direction (the X direction of FIG. 4A) as described above with reference to FIGS. 3A to 3C. As described above, since the focus F level of the laser is the same as the level of the upper surface 100T of the semiconductor package 100*a*, energy of the laser is concentrated on the upper surface 100T of the semiconductor package 100*a* so that the laser drilling process of forming the opening GD may be performed.

Referring to FIGS. 4B and 4C, the laser processing unit 1300 scans a laser onto the upper surfaces 100T of the semiconductor packages 100*b* and 100*c* to form marking units Mb and Mc. It is noted that depths of the marking units Mb and Mc along the X axis, as well as widths along the Y axis, are smaller than those of the opening GD in FIG. 4A.

At this time, the focus F level of the laser scanned by the laser processing unit 1300 may be lower than the level of the upper surface 100T of the semiconductor package 100*b* or higher than the level of the upper surface 100T of the semiconductor package 100*c*. That is, during marking of the semiconductor packages 100*b* and 100*c*, the laser emitted by the processing unit 1300 is defocused when scanned onto the upper surfaces 100T of the semiconductor packages 100*b* and 100*c*.

As described above, since the laser is defocused during scanning in FIGS. 4B-4C, even when the laser has the same output and wavelength as those used during the drilling process in FIG. 4A, a laser marking process, rather than a drilling process, may be performed. That is, defocusing of the laser causes lower energy to emit during the marking process, i.e., as compared to the energy during the drilling process described with reference to FIG. 4A, toward the upper surfaces 100T of the semiconductor packages 100*b* and 100*c*. Therefore, the defocused laser forms the marking units Mb and Mc in the semiconductor packages 100*b* and 100*c*, respectively, rather than the opening GD.

The focus F level of the laser may be controlled before the laser marking process. As described above, the focus F level of the laser may be controlled by moving the laser processing unit 1300 in the first direction (the X direction of FIG. 4B).

An order of the laser drilling process described with reference to FIG. 4A and the laser marking process described with reference to FIGS. 4B and 4C is not limited. The focus F level of the laser may be controlled between the laser drilling process and the laser marking process.

As described above, the laser marking and drilling processes may be performed, e.g., sequentially, by one laser facility, e.g., by a same apparatus, so that processes and working time may be reduced. As a result, productivity may be improved and manpower and facilities required for maintaining processes may be minimized.

Figure 5A:
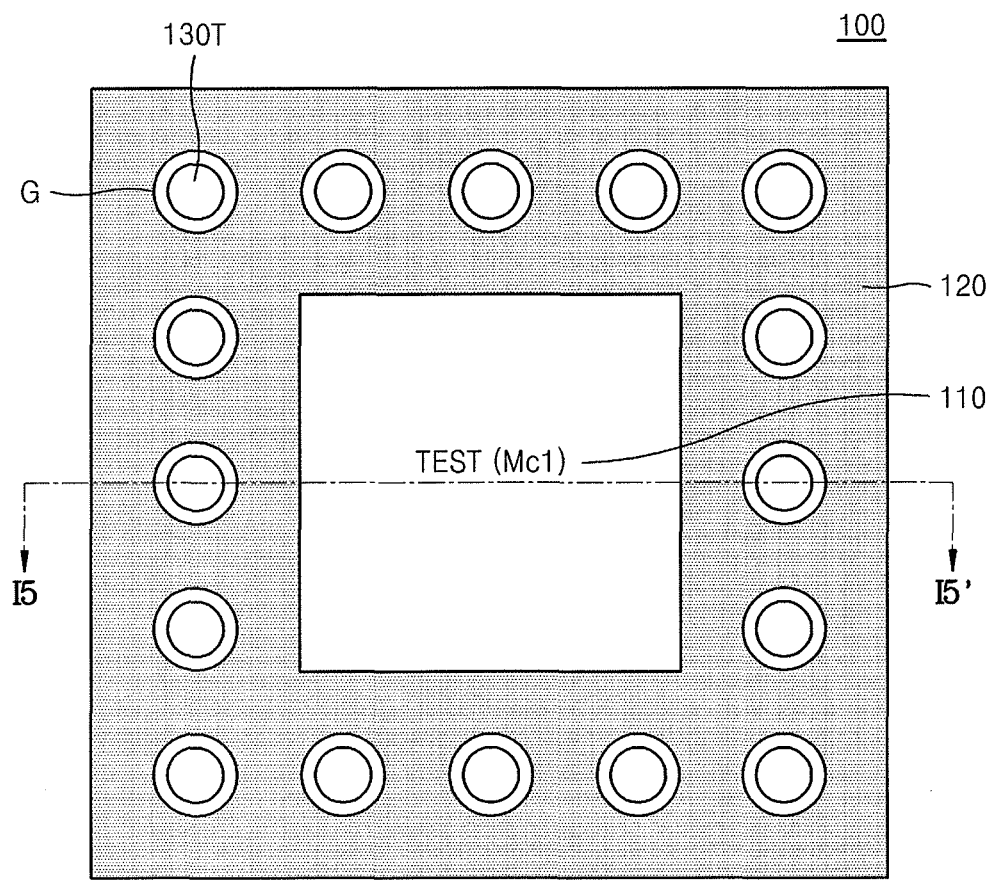
FIG. 5A illustrates a plan view of a stacked semiconductor package manufactured by a method according to an embodiment.
Figure 5B:
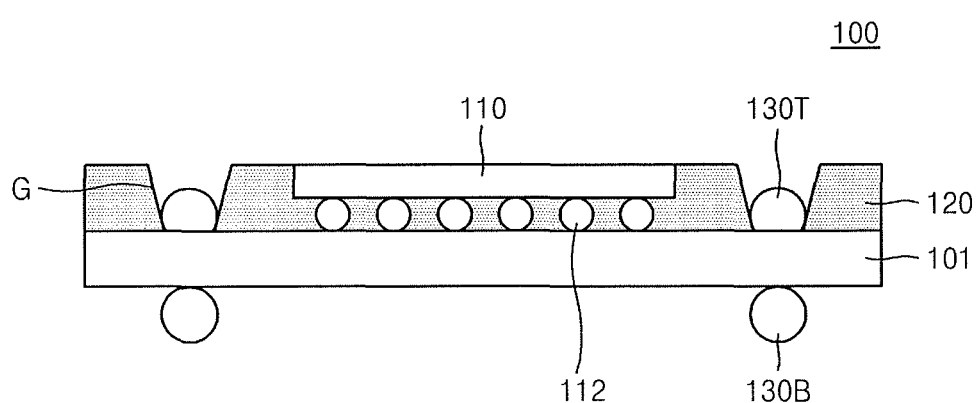
FIG. 5B illustrates a cross-sectional view taken along line 15-15' of FIG. 5A.

FIG. 5A is a plan view of a stacked semiconductor package manufactured by a method according to an embodiment. FIG. 5B is a cross-sectional view taken along the line 15-15' of FIG. 5A. In FIGS. 5A to 5B, same reference numerals as those of FIGS. 1 to 4C denote the same elements.

Referring to FIGS. 5A and 5B, the semiconductor package 100 may include a PCB 101, a semiconductor chip 110 mounted on an upper surface of the PCB 101, a molding unit 120 that covers the PCB 101, solder balls 130T attached onto the upper surface of the PCB 101, and solder balls 130B attached onto a lower surface of the PCB 101.

The PCB 101, the semiconductor chip 110, the molding unit 120, and the solder balls 130T and 130B may be manufactured by processes similar to those of the PCB 101_1, the semiconductor chip 110_1, the molding unit 120_1, and the solder balls 130T_1 and 130B_1 described previously with reference to FIGS. 2A-2D. Here, only a marking unit Mc1 formed on an upper surface of the semiconductor chip 110 by a laser marking process and openings G formed in the molding unit 120 by a laser drilling process will be additionally described.

An order of the laser marking and drilling processes is not limited. In the current embodiment, for convenience, after forming the openings G by the laser drilling process, the marking unit Mc1 is formed by the laser marking process.

In order to perform the laser drilling process, the laser scanned by the laser processing unit 1300 of the laser supply apparatus 1000 is focused. That is, the focus F level of the laser is adjusted to be the same as a level of the upper surface 100T of the semiconductor package 100 (refer to FIG. 4A).

In addition, since the laser drilling process is performed in a region where the molding unit 120 is positioned, the Y mirror 1320 and the Z mirror 1330 of the scanner 1300a are controlled (refer to FIG. 3B) so that Y and Z coordinates of the laser focus F are formed in the region where the molding unit 120 is positioned. In the current embodiment, since the openings G at least partially expose the solder balls 130T, while the Y and Z coordinates of the laser focus F remain in the solder balls 130T, a laser drilling process is performed. The laser drilling process may be performed for about two to three minutes.

After the laser drilling process, the laser processing unit 1300 is moved in the first direction (the X direction of FIG. 4A) by using the X axis motor 1350 so that the focus F level of the laser scanned by the laser processing unit 1300 is adjusted to be higher or lower than the level of the upper surface 100T of the semiconductor package 100 to defocus the laser (refer to FIGS. 4B and 4C). In addition, in the current embodiment, since the laser marking process is performed in a region where the semiconductor chip 110 is positioned, the Y mirror 1320 and the Z mirror 1330 of the scanner 1300a are controlled (refer to FIG. 3B) so that the Y and Z coordinates of the laser focus F are formed in the region where the semiconductor chip 110 is positioned.

As described above, after controlling the Y and Z coordinates and the focus F level, the laser is scanned onto the upper surface of the semiconductor chip 110 to form the marking unit Mc1. The marking unit Mc1 may be a character, shape, or identification symbol desired by a user (in the current embodiment, "TEST"). The laser marking process may be performed for about one to two minutes.

Figure 6:
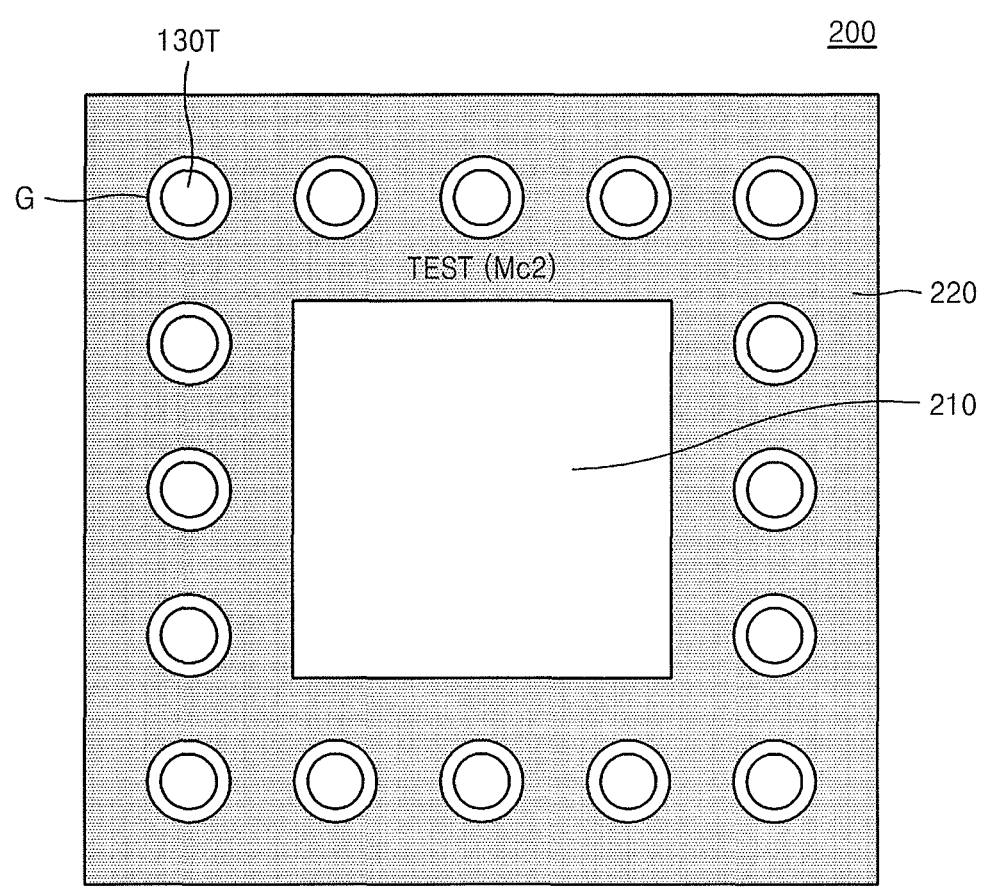
FIG. 6 illustrates a plan view of a stacked semiconductor package manufactured by a method according to another embodiment.

FIG. 6 is a plan view of a stacked semiconductor package manufactured by a method according to another embodiment. In FIG. 6, the same reference numerals as those of FIGS. 1 to 5B denote the same elements.

Referring to FIG. 6, a semiconductor package 200 may include a semiconductor chip 210 and a molding unit 220. In the current embodiment, the semiconductor package 200 has a structure similar to that of the semiconductor package 100 described with reference to FIGS. 5A and 5B, except for a marking unit Mc2 in the molding unit 220 (rather than in the semiconductor chip 210).

That is, the marking unit Mc2 may be formed in the molding unit 220 between the semiconductor chip 210 and the openings G, as illustrated in FIG. 6, by the laser marking process. However, embodiments are not limited thereto, e.g., the marking unit Mc2 may be formed in any region of the molding unit 220 where the openings G are not formed.

Figure 7A:
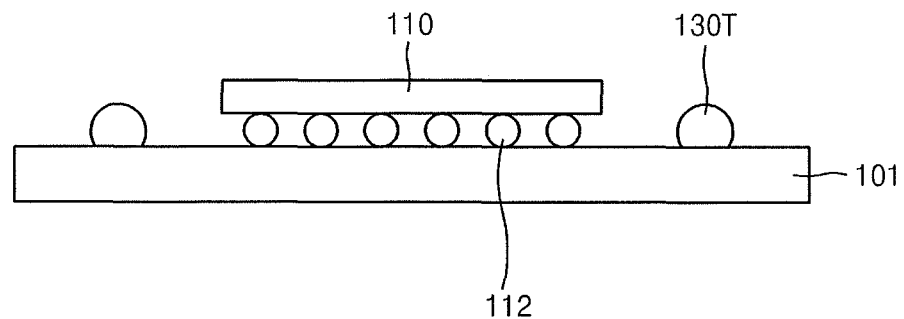
FIGS. 7A to 7C illustrate cross-sectional views of processes of a method of manufacturing a stacked semiconductor package according to another embodiment.
Figure 7B:
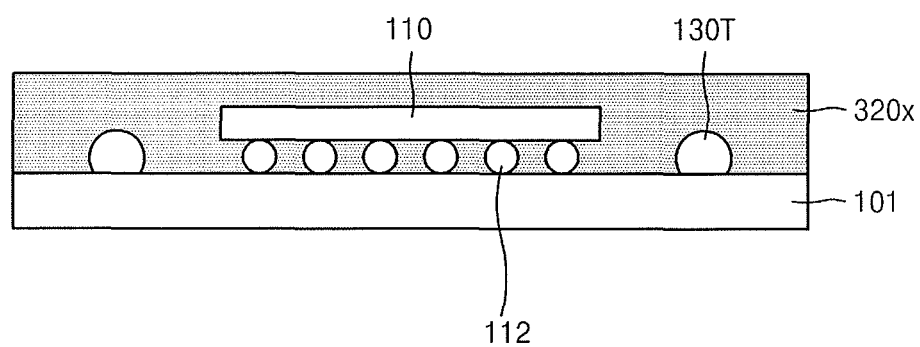
Figure 7C:
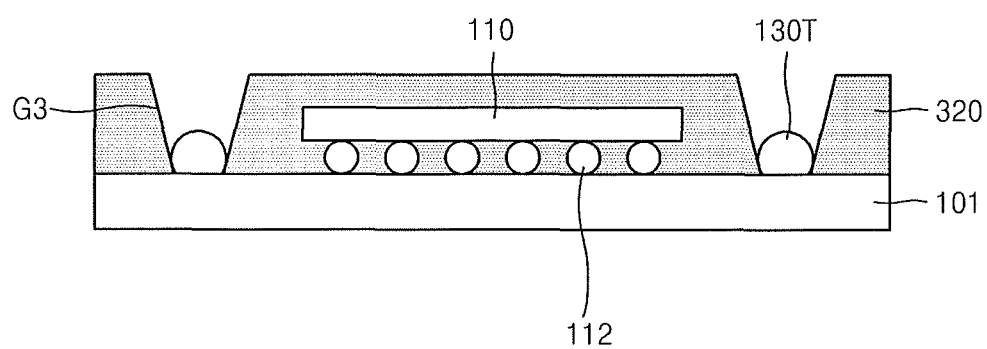

FIGS. 7A to 7C are cross-sectional views illustrating processes of a method of manufacturing a stacked semiconductor package according to another embodiment. In FIGS. 7A to 7C, same reference numerals as those of FIGS. 1 to 6 denote same elements.

Referring to FIGS. 7A and 7B, after the semiconductor chip 110 is mounted on the upper surface of the PCB 101 and the solder balls 130T are attached onto the upper surface of the PCB 101, a mold layer 320x that covers the upper surface of the PCB 101 is formed. The mold layer 120x_1 described with reference to FIG. 2C is processed to be at a same level with the upper surface of the semiconductor chip 110_1.

However, the mold layer 320x covers the upper surface of the semiconductor chip 110, so an upper surface of a molding unit 320 is higher than the upper surface of the semiconductor chip 110.

Referring to FIG. 7C, a laser drilling process is performed in the mold layer 320x to form the molding unit 320 having openings G3 that expose the solder balls 130T and a marking unit (not shown) is formed in an upper surface of the molding unit 320 by a laser marking process. The marking unit may be formed in any region of the molding unit 320 where the openings G3 are not formed.

Figure 8A:
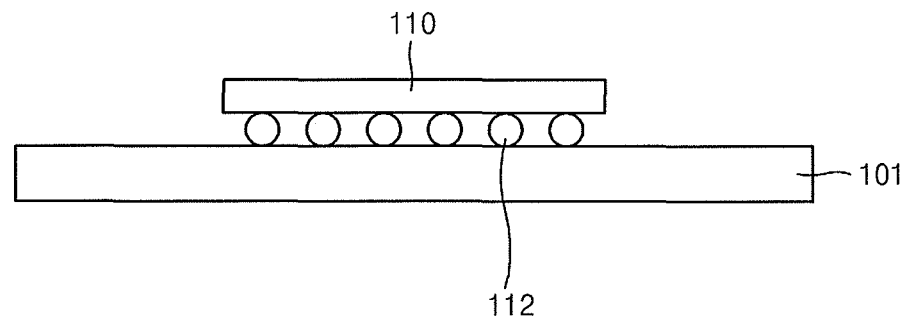
FIGS. 8A to 8D illustrate cross-sectional views of processes of a method of manufacturing a stacked semiconductor package according to another embodiment.
Figure 8B:
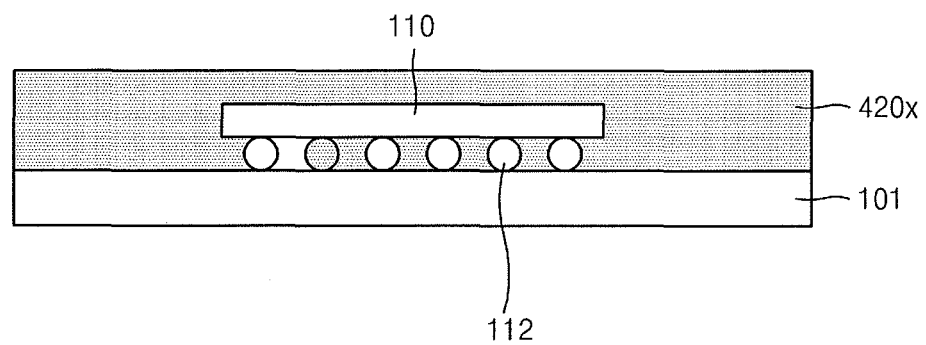

FIGS. 8A to 8D are cross-sectional views illustrating processes of a method of manufacturing a stacked semiconductor package according to another embodiment. In FIGS. 8A and 8B, same reference numerals as those of FIGS. 1 to 7C denote same elements.

Referring to FIGS. 8A and 8B, after the semiconductor chip 110 is mounted on the upper surface of the PCB 101, a mold layer 420x that covers the upper surface of the PCB 101 is formed. Solder balls (not shown) are not attached to the mold layer 420x unlike in FIGS. 7A and 7B.

Figure 8C:
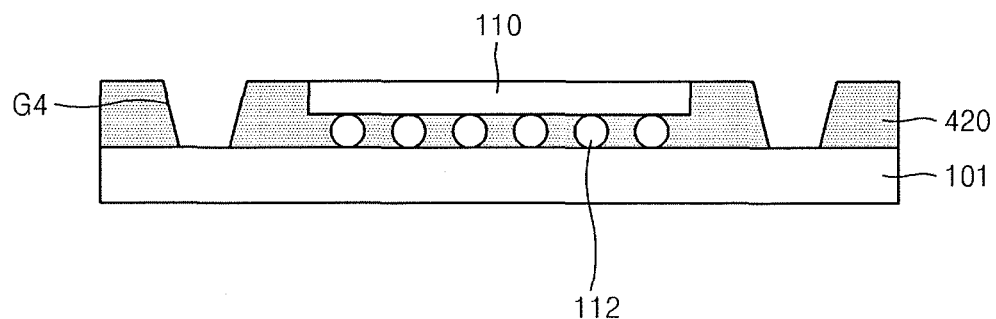

Referring to FIG. 8C, a laser drilling process is performed in the mold layer 420x to form a molding unit 420 having openings G4 and a marking unit (not shown) is formed in the upper surface of the semiconductor chip 110 or an upper surface of the molding unit 420 where the openings G4 are not formed by a laser marking process. As described above, an order of the laser marking and drilling processes is not limited.

Figure 8D:
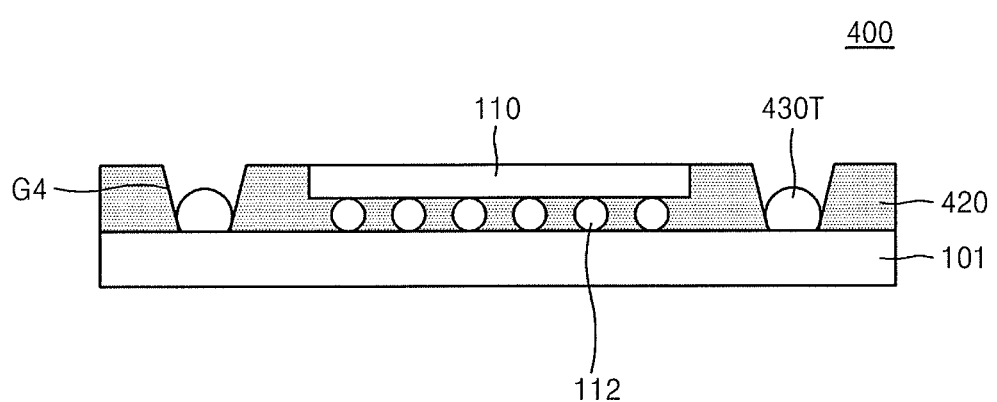

Referring to FIG. 8D, solder balls 430T may partially fill the openings G4. However, embodiments are not limited thereto. The solder balls 430T may entirely fill the openings G4. In addition, the solder balls 430T may be at a higher level than an upper surface of a semiconductor package 400.

Figure 9:
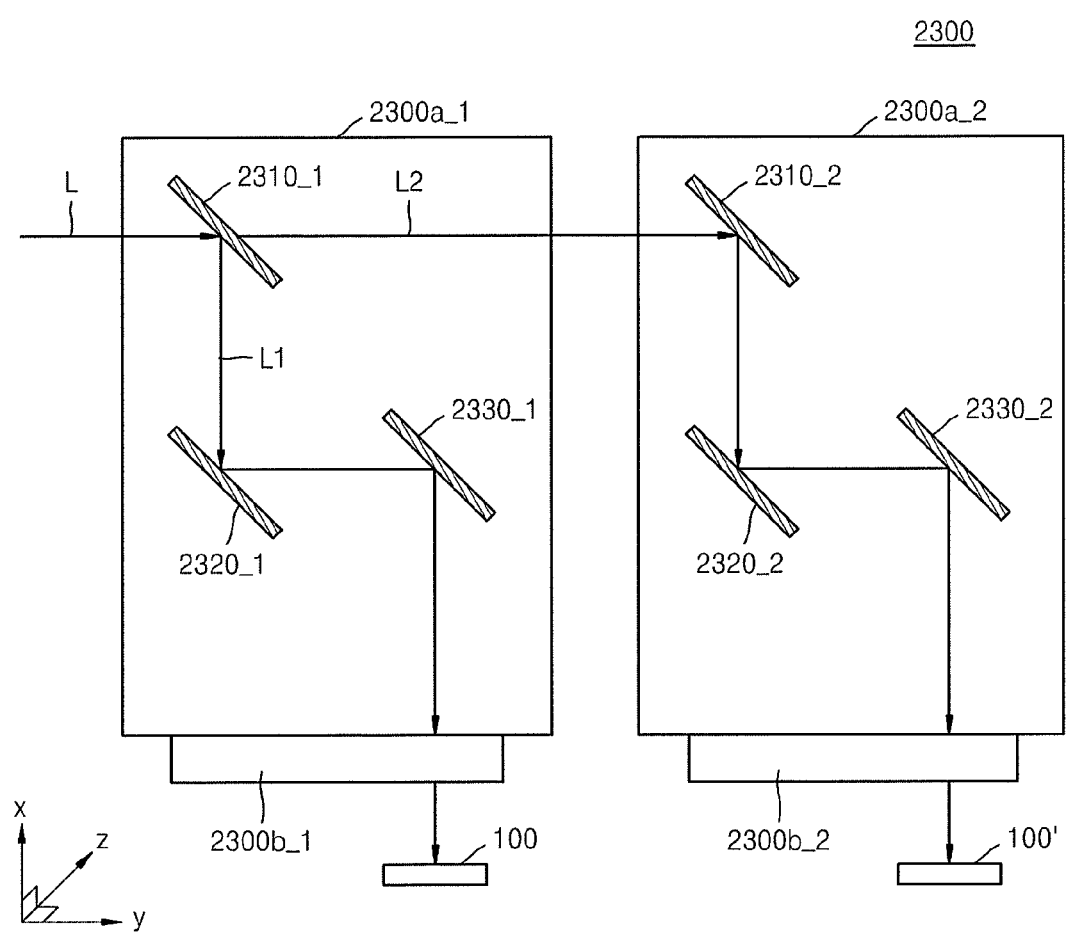
FIG. 9 illustrates a conceptual diagram of a laser process unit for manufacturing a stacked semiconductor package according to another embodiment.

FIG. 9 is a conceptual diagram of a laser process unit for manufacturing a stacked semiconductor package according to another embodiment. In FIG. 9, same reference numerals as those of FIGS. 1 to 8D denote the same elements.

Referring to FIG. 9, a laser processing unit 2300 processes a laser emitted by a laser light source (not shown) and scans the processed laser to the semiconductor packages 100 and 100' to perform a laser marking and/or drilling process. Each of the semiconductor packages 100 and 100' may be the lower semiconductor package 100_1 before attaching the solder balls 130B_1 (refer to FIGS. 1 to 2D), a repeated description of which will be omitted for convenience.

The laser processing unit 2300 may be included in a laser supply apparatus (not shown) like the laser processing unit 1300 described with reference to FIGS. 3A to 3C. The laser processing unit 2300 may include a first scanner 2300a_1 and a second scanner 2300a_2, with a first telecentric lens 2300b_1 and a second telecentric lens 2300b_2 respectively arranged under the first scanner 2300a_1 and the second scanner 2300a_2.

In the current embodiment, the laser processing unit 2300 has a structure and function similar to those of the laser processing unit 1300 described with reference to FIG. 3B, except including a plurality of scanners and telecentric lenses. In the current embodiment, the laser processing unit 2300 is illustrated as including two scanners and two telecentric lenses. However, the numbers of scanners and telecentric lenses included in the laser processing unit 2300 are not limited thereto.

The first scanner 2300a_1 may include a beam splitter 2310_1 for dividing a laser L emitted by a laser light source (not shown) into a first laser L1 and a second laser L2, a Y mirror 2320_1 for changing a path of the first laser L1 to a second direction (the Y direction of FIG. 9) parallel to the upper surface of the semiconductor package 100, a Z mirror 2330_1 for changing the path of the first laser L1 to a third direction (the Z direction of FIG. 9) parallel to the upper surface of the semiconductor package 100 and orthogonal to the second direction, and a Y axis motor (not shown) and a Z axis motor (not shown) for controlling the Y mirror 2320_1 and the Z mirror 2330_1.

The second scanner 2300a_2 includes a reflecting mirror 2310_2 for reflecting the second laser L2, a Y mirror 2320_2 for changing a path of the second laser L2 to the second direction, a Z mirror 2330_2 for changing the path of the second laser L2 to the third direction, and a Y axis motor (not shown) and a Z axis motor (not shown) for controlling the Y mirror 2320_2 and the Z mirror 2330_2.

Although not shown, as the scanner 1300a described with reference to FIG. 3B, the first scanner 2300a_1 and the second scanner 2300a_2 may respectively include X axis motors (not shown) so that the first scanner 2300a_1 and the second scanner 2300a_2 may move in a first direction (the X direction of FIG. 9) perpendicular to a plane (a plane formed by the Y and Z axes of FIG. 9) formed by the upper surfaces of the semiconductor packages 100 and 100'. In this case, since the first telecentric lens 2300b_1 and the second telecentric lens 2300b_2 are fixed to lower portions of the first scanner 2300a_1 and the second scanner 2300a_2, the first telecentric lens 2300b_1 and the second telecentric lens 2300b_2 move in the first direction together with the first scanner 2300a_1 and the second scanner 2300a_2. On the other hand, the first scanner 2300a_1 and the second scanner 2300a_2 may not respectively include the X axis motors (not shown), so the laser processing unit 2300 may include only one X axis. As such, the laser processing unit 2300 may move in the first direction in its entirety.

The first telecentric lens 2300b_1 and the second telecentric lens 2300b_2 respectively transmit the lasers L1 and L2 scanned by the first scanner 2300a_1 and the second scanner 2300a_2 to the first semiconductor package 100 and the second semiconductor package 100'. Like the telecentric lens 1300b (refer to FIG. 3B), the first telecentric lens 2300b_1 and the second telecentric lens 2300b_2 may respectively include image-space telecentric lenses (not shown) that make the first and second lasers L1 and L2 parallel with a laser optical axis (not shown) and object-space telecentric lenses (not shown) for concentrating the lasers L1 and L2 incident to be parallel with the optical axis through the image-space telecentric lenses (not shown).

As described above, the laser processing unit 2300 may include the plurality of scanners and telecentric lenses so that the laser marking or drilling process may be simultaneously performed on the plurality of semiconductor packages only by one light source (not shown).

By way of summation and review, according to embodiments, a method of manufacturing a stacked semiconductor package is provided which includes marking and drilling processes of the semiconductor package by a same laser supply apparatus, e.g., by a same laser source. That is, a laser focus level of the apparatus may be controlled by moving at least a part of the apparatus, thereby providing either marking or drilling processes on a same semiconductor package by the same laser source. This may reduce processing operations and time, e.g., as compared to performance of drilling and marking processes by different lasers and/or apparatuses.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a stacked semiconductor package, the method comprising:
   forming a semiconductor package, the semiconductor package including:
      one or more semiconductor chips on an upper surface of a printed circuit board (PCB), and
      a mold layer covering the upper surface of the PCB;
   marking the semiconductor package with an identification mark by scanning a laser of a laser supply apparatus onto the semiconductor package;
   controlling a focus level of the laser; and
   performing laser drilling on the mold layer of the semiconductor package to form openings,
   wherein controlling the focus level of the laser includes focusing a lens of the laser supply apparatus to perform drilling, and defocusing the lens of the laser supply apparatus to perform marking.

2. The method as claimed in claim 1, wherein controlling the focus level of the laser includes moving at least a part of the laser supply apparatus in a first direction perpendicular to a plane formed by an upper surface of the semiconductor package.

3. The method as claimed in claim 1, wherein controlling the focus level of the laser includes a first adjustment of the focus level of the laser before marking the semiconductor package.

4. The method as claimed in claim 3, wherein the first adjustment of the focus level of the laser includes adjusting the focus level of the laser to be lower than a level of the upper surface of the semiconductor package.

5. The method as claimed in claim 3, wherein the first adjustment of the focus level of the laser includes adjusting the focus level of the laser to be higher than a level of the upper surface of the semiconductor package.

6. The method as claimed in claim 1, wherein controlling of the focus level of the laser includes a second adjustment of the focus level of the laser before performing the laser drilling on the mold layer to form the openings.

7. The method as claimed in claim 6, wherein the second adjustment includes adjusting the focus level of the laser to be the same as a level of the upper surface of the semiconductor package.

8. The method as claimed in claim 1, wherein forming the semiconductor package includes:
   forming solder balls on the upper surface of the PCB;
   forming the mold layer to cover the upper surface of the PCB and the solder balls; and
   at least partially exposing the solder balls through the openings in the mold.

9. The method as claimed in claim 1, wherein:
   the laser supply apparatus includes:
      a Y mirror for changing a path of the laser to a second direction parallel to the upper surface of the semiconductor package, and a Z mirror for changing the path of the laser to a third direction parallel to the upper surface of the semiconductor package and orthogonal to the second direction, and scanning the laser onto the semiconductor package includes controlling the Y and Z mirrors to focus the laser at Y and Z coordinates to perform the marking or laser drilling on the semiconductor package.

10. The method as claimed in claim 9, wherein the Y and Z coordinates include:

first Y and Z coordinates designating location for the laser drilling; and second Y and Z coordinates designating location for the marking, the second Y and Z coordinates being positioned in one of the one or more semiconductor chips.

11. The method as claimed in claim 9, wherein the Y and Z coordinates include:

first Y and Z. coordinates designating location for the laser drilling; and second Y and Z coordinates designating location for the marking, the second Y and Z coordinates being positioned in the mold layer.

12. A method of manufacturing a stacked semiconductor package, the method comprising:

forming a lower semiconductor package; and stacking an upper semiconductor package on the lower semiconductor package, wherein forming the lower semiconductor package includes:

mounting one or more semiconductor chips on an upper surface of a PCB, forming first solder balls on the upper surface of the PCB, forming a mold layer covering the upper surface of the PCB and the first solder balls, marking the lower semiconductor package with an identification mark by scanning a laser of a laser supply apparatus onto the lower semiconductor package, controlling a focus level of the laser, performing laser drilling on the mold layer of the lower semiconductor package to form openings, and forming second solder balls on a lower surface of the PCB, wherein controlling the focus level of the laser includes focusing a lens of the laser supply apparatus to perform drilling, and defocusing the lens of the laser supply apparatus to perform marking.

13. The method as claimed in claim 12, wherein performing laser drilling on the mold layer to form openings includes forming the openings with inclined side surfaces.

14. The method as claimed in claim 12, wherein the laser scanned by the laser supply apparatus has a single wavelength.

15. The method as claimed in claim 12, wherein marking the lower semiconductor package and performing the laser drilling on the mold layer are performed by using a single light source.

16. A method of manufacturing a stacked semiconductor package, the method comprising:

forming a semiconductor package, the semiconductor package including:

one or more semiconductor chips on an upper surface of a printed circuit board (PCB), and a mold layer covering the upper surface of the PCB;

marking the semiconductor package with an identification mark by scanning a laser of a laser supply apparatus onto the semiconductor package;

controlling a focus level of the laser; and drilling the mold layer of the semiconductor package by scanning the laser of the laser supply apparatus onto the semiconductor package to form openings through the mold, wherein controlling the focus level of the laser includes focusing a lens of the laser supply apparatus to perform drilling, and defocusing the lens of the laser source to perform marking.

17. The method as claimed in claim 16, wherein marking and drilling of the semiconductor package is performed by a same laser source.

18. The method as claimed in claim 17, wherein:

marking includes forming at least a first cavity in the semiconductor package; and drilling includes forming at least a second cavity in the semiconductor package, the at least second cavity being deeper than the first cavity.

19. The method as claimed in claim 16, wherein laser irradiation toward the semiconductor package during marking is shorter than during drilling.

* * * * *